(12) United States Patent
Sreedharamurthy et al.

(10) Patent No.: US 8,398,765 B2
(45) Date of Patent: Mar. 19, 2013

(54) CONTROLLING A MELT-SOLID INTERFACE SHAPE OF A GROWING SILICON CRYSTAL USING AN UNBALANCED MAGNETIC FIELD AND ISO-ROTATION

(75) Inventors: Hariprasad Sreedharamurthy, Ballwin, MO (US); Milind Kulkarni, St. Louis, MO (US); Richard G. Schrenker, Chesterfield, MO (US); Joseph C. Holzer, St. Peters, MO (US); Harold W. Korb, Chesterfield, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 909 days.

(21) Appl. No.: 12/493,766

(22) Filed: Jun. 29, 2009

(65) Prior Publication Data
US 2009/0320743 A1 Dec. 31, 2009

Related U.S. Application Data

(60) Provisional application No. 61/077,082, filed on Jun. 30, 2008.

(51) Int. Cl.
*C30B 15/02* (2006.01)
(52) U.S. Cl. ............... 117/13; 117/17; 117/18; 117/30
(58) Field of Classification Search ............. 117/13, 117/17, 18, 30
See application file for complete search history.

(56) References Cited

U.S. PATENT DOCUMENTS

| | | | |
|---|---|---|---|
| 6,200,384 B1 * | 3/2001 | Kishida et al. | 117/30 |
| 6,458,204 B1 * | 10/2002 | Okui et al. | 117/30 |
| 7,223,304 B2 | 5/2007 | Lu | |
| 7,291,221 B2 | 11/2007 | Korb | |
| 2006/0144320 A1 | 7/2006 | Korb | |
| 2006/0144321 A1 | 7/2006 | Lu | |
| 2007/0022943 A1 | 2/2007 | Hong et al. | |
| 2007/0227442 A1 | 10/2007 | Lu | |
| 2007/0240629 A1 * | 10/2007 | Kotooka et al. | 117/13 |

FOREIGN PATENT DOCUMENTS

| | | |
|---|---|---|
| DE | 19529481 A1 | 2/1997 |
| JP | 10114597 * | 5/1998 |

OTHER PUBLICATIONS

PCT International Search Report and the Written Opinion regarding PCT/US2009/049069, Aug. 31, 2009, 12 pgs., International Searching Authority, Netherlands.
PCT International Search Report and the Written Opinion regarding PCT/US2009/053002, Sep. 17, 2009, 15 pgs., International Searching Authority, Netherlands.
D. Vizman et al., "ScienceDirect, Journal of Crystal Growth," Influence of Different Types of Magnetic Fields on the Interface Shape in a 200mm Si-EMCZ Configuration, 2007, 221-225 pgs., vol. 303 Issue 1, Elsevier, Erlangen, Germany.

(Continued)

*Primary Examiner* — Bob M Kunemund
(74) *Attorney, Agent, or Firm* — Armstrong Teasdale LLP

(57) ABSTRACT

A system for growing silicon crystals that facilitates controlling a shape of a melt-solid interface is described. The crystal growing system includes a heated crucible including a semiconductor melt from which a monocrystalline ingot is grown according to a Czochralski process. The ingot is grown on a seed crystal pulled from the melt. The method includes applying an unbalanced cusped magnetic field to the melt, and rotating the ingot and the crucible in the same direction while the ingot is being pulled from the melt.

19 Claims, 11 Drawing Sheets

OTHER PUBLICATIONS

Masahito Watanabe et al., "ScienceDirect, Journal of Crystal Growth," Large Modification of Crystal-Melt Interface Shape During Si Crystal growth by Using Electromagnetic Czochralski Method (EMCZ), 2006, 252-256 pgs., vol. 292 Issue 2, Elsevier, Erlangen, Germany.

Written Opinion issued in related Singapore Patent Application No. 201009025-6 dated Jan. 19, 2012; 7 pages.

European Communication First Examination Report regarding Application No. 09774246.4-2122 dated Sep. 16, 2011; 4 pages.

Written Submission issued in related European Patent Application No. 09774246.4 dated Jul. 9, 2012; 4 pages.

Office action issued in related Chinese Patent Application No. 2009801253194, dated May 9, 2012.

* cited by examiner

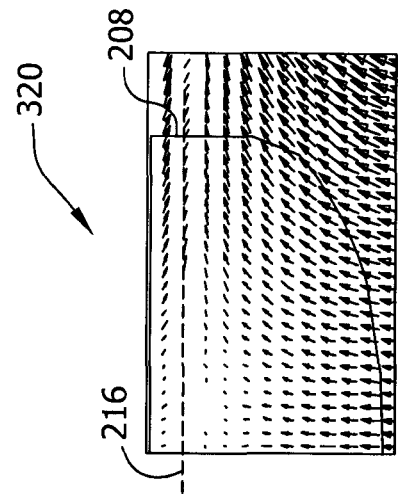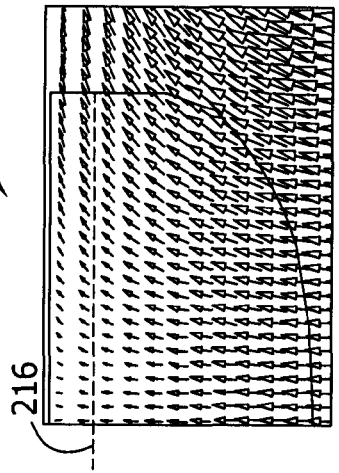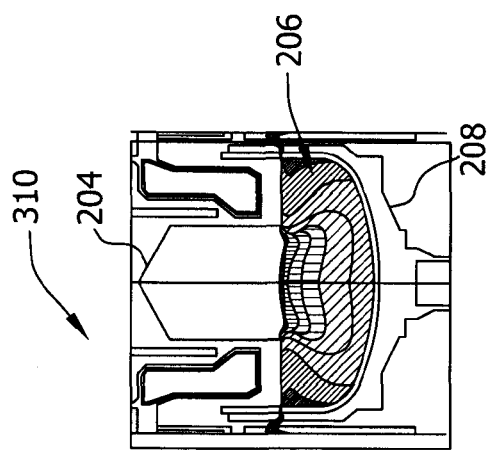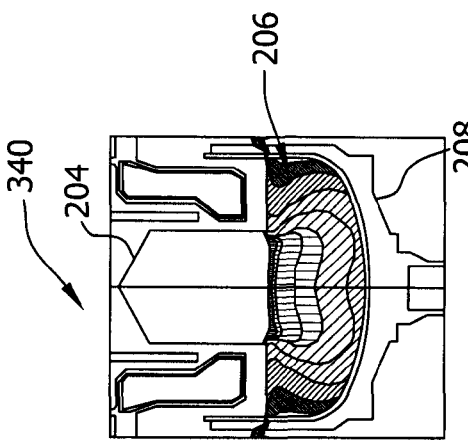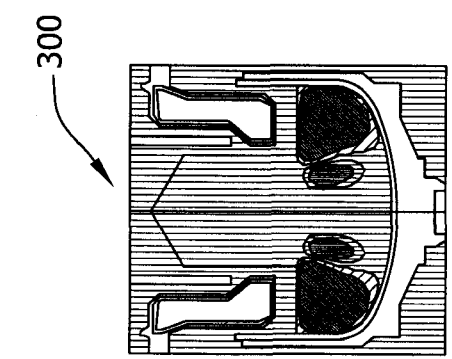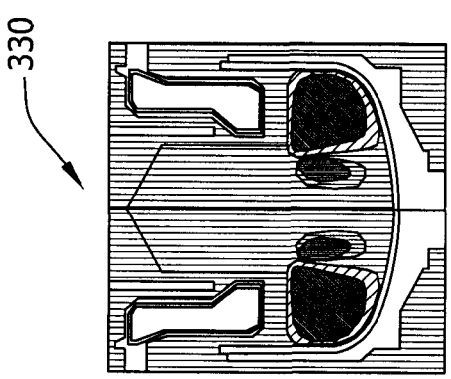
FIG. 8A  FIG. 8B  FIG. 8C
FIG. 9A  FIG. 9B  FIG. 9C

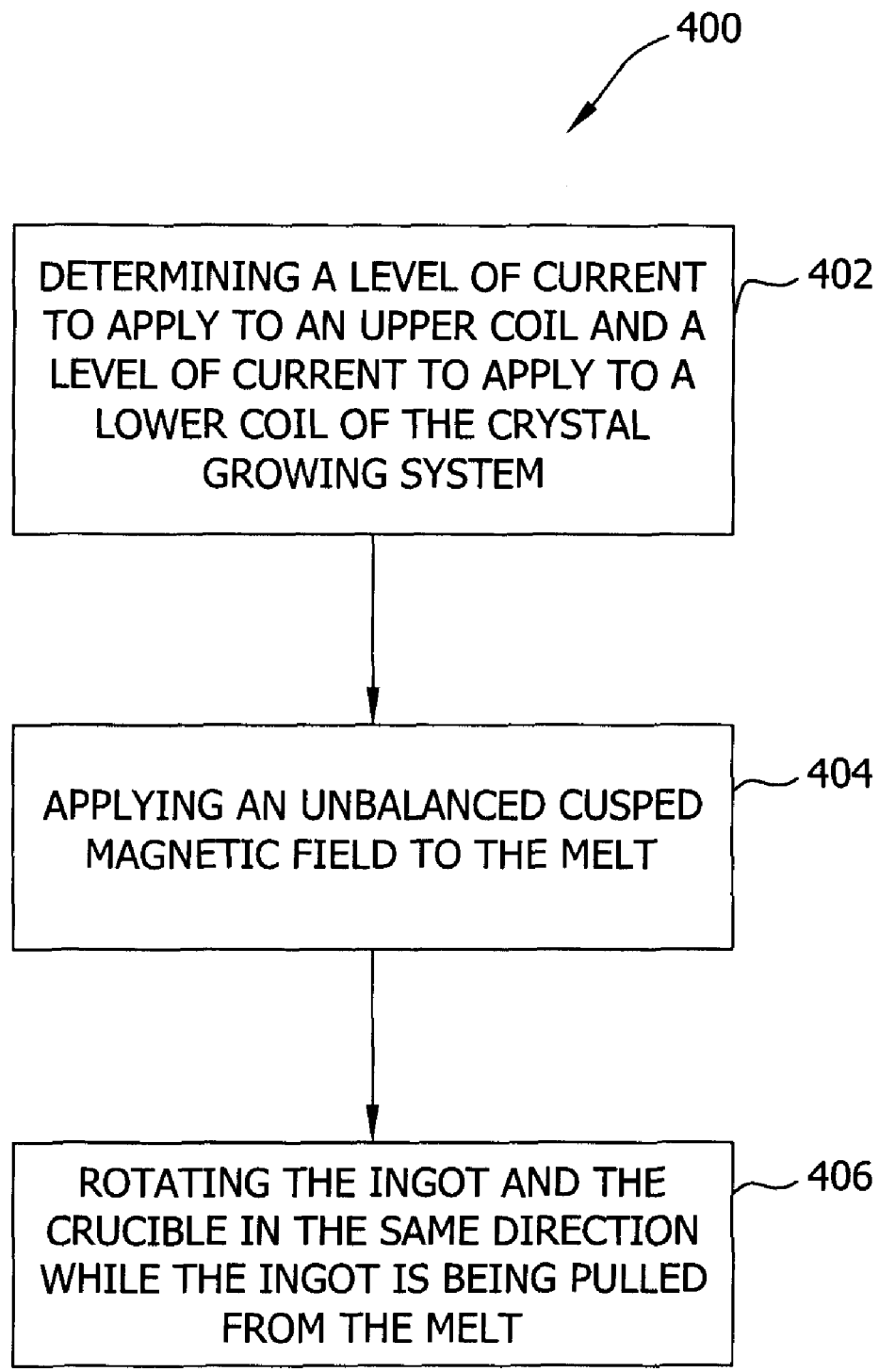

CONTROLLING A MELT-SOLID INTERFACE SHAPE OF A GROWING SILICON CRYSTAL USING AN UNBALANCED MAGNETIC FIELD AND ISO-ROTATION

CROSS-REFERENCE TO RELATED APPLICATION

This application claims the benefit of U.S. Provisional Application No. 61/077,082, filed Jun. 30, 2008, which is hereby incorporated by reference in its entirety.

BACKGROUND

Single crystal silicon, which is the starting material in most processes for fabricating semiconductor electronic components, is commonly prepared according to the so-called Czochralski process. In this process, polycrystalline silicon, or polysilicon, is charged to a crucible and melted, a seed crystal is brought into contact with the molten silicon, and a single crystal (also referred to herein as monocrystalline) ingot is grown by relatively slow extraction. After formation of a neck is complete, decreasing the pulling rate and/or the melt temperature enlarges the diameter of the crystal until a desired or target diameter is reached. The generally cylindrical main body of the crystal, which has an approximately constant diameter, is then grown by controlling the pull rate and the melt temperature while compensating for the decreasing melt level. Near the end of the growth process but before the crucible is emptied of molten silicon, the crystal diameter is gradually reduced to form an end-cone. Typically, increasing the crystal pull rate and heat supplied to the crucible forms the end-cone. When the diameter becomes small enough, the crystal is then separated from the melt.

To produce semiconductor grade single crystal silicon, and more specifically, large, substantially defect-free crystals, the behavior of a solidification interface, which includes a peripheral edge of the crystal being grown, must be controlled. The solidification interface of the crystal being grown is also referred to herein as a melt-solid interface. A shape of the melt-solid interface is an important factor in obtaining a suitable process window for producing single crystal silicon.

Accordingly, improved control of the crystal growth process is desired to control the shape of the melt-solid interface to facilitate increasing the process window for production of single crystal silicon.

BRIEF DESCRIPTION

In one aspect, a method of controlling crystal growth in a crystal growing system is provided. The crystal growing system includes a heated crucible that includes a semiconductor melt from which a monocrystalline ingot is grown according to a Czochralski process. The ingot is grown on a seed crystal pulled from the melt. The method includes applying an unbalanced cusped magnetic field to the melt, and rotating the ingot and the crucible in the same direction while the ingot is being pulled from the melt.

In another aspect, a system for growing silicon crystals that facilitates controlling a shape of a melt-solid interface is provided. The crystal growing system includes a heated crucible that includes a semiconductor melt from which a monocrystalline ingot is grown according to a Czochralski process. The ingot is grown on a seed crystal pulled from the melt and the melt and the ingot form the melt-solid interface therebetween. The system includes a first set of coils and a second set of coils positioned adjacent to an exterior of the crucible for generating an unbalanced cusped magnetic field, and a crucible drive unit and a crystal drive unit configured to rotate the crucible and the crystal in the same direction.

BRIEF DESCRIPTION OF THE DRAWINGS

FIGS. 8A, 8B, and 8C illustrate an exemplary melt flow simulation, an exemplary temperature field simulation, and an exemplary magnetic field vector simulation, respectively, during crystal growth under a balanced cusped magnetic field.

FIGS. 9A, 9B, and 9C illustrate an exemplary melt flow simulation, an exemplary temperature field simulation, and an exemplary magnetic field vector simulation, respectively, during crystal growth under an unbalanced cusped magnetic field.

FIG. 13 is a flowchart of an exemplary method for controlling crystal growth in a crystal growing system, for example, the system shown in FIG. 4.

DETAILED DESCRIPTION

Controlling a shape of a melt-solid interface is an important factor in determining the quality of silicon crystal produced. The shape of the melt-solid interface is dependent on process parameters such as, but not limited to, temperatures, crucible or crystal rotation, and crystal pulling rate. By fixing these process parameters, the melt-solid interface is also fixed. In an exemplary embodiment, a magnetic field applied during the crystal growing process also affects the shape of the melt-solid interface. Magnetic fields may be used to stabilize convective flows in metal and semiconductor melts and to dampen natural convective flow and turbulence. There are three conventional types of magnetic field configurations used to stabilize convective flows in conductive melts, namely, axial, horizontal, and cusped.

Figure 1:
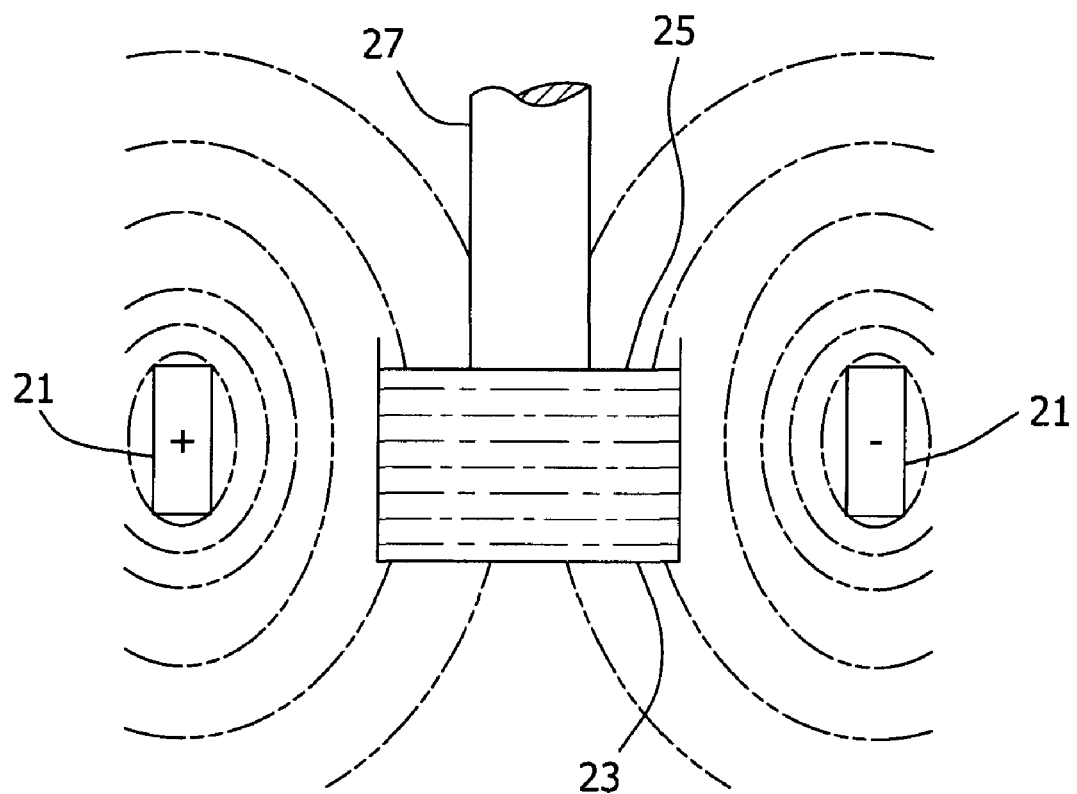
FIG. 1 is a block diagram illustrating an axial (also referred to herein as vertical) magnetic field being applied to a crucible containing a melt in a crystal growing apparatus.

FIG. 1 is a block diagram illustrating an axial (also referred to herein as vertical) magnetic field being applied to a crucible 23 containing a melt 25 in a crystal growing apparatus. The axial magnetic field configuration generates a magnetic field parallel to the crystal-growth direction. In FIG. 1, a magnet coil 21, shown in cross-section, supplies a magnetic field to crucible 23. As shown, crucible 23 contains silicon melt 25 from which a crystal 27 is grown.

Figure 2:
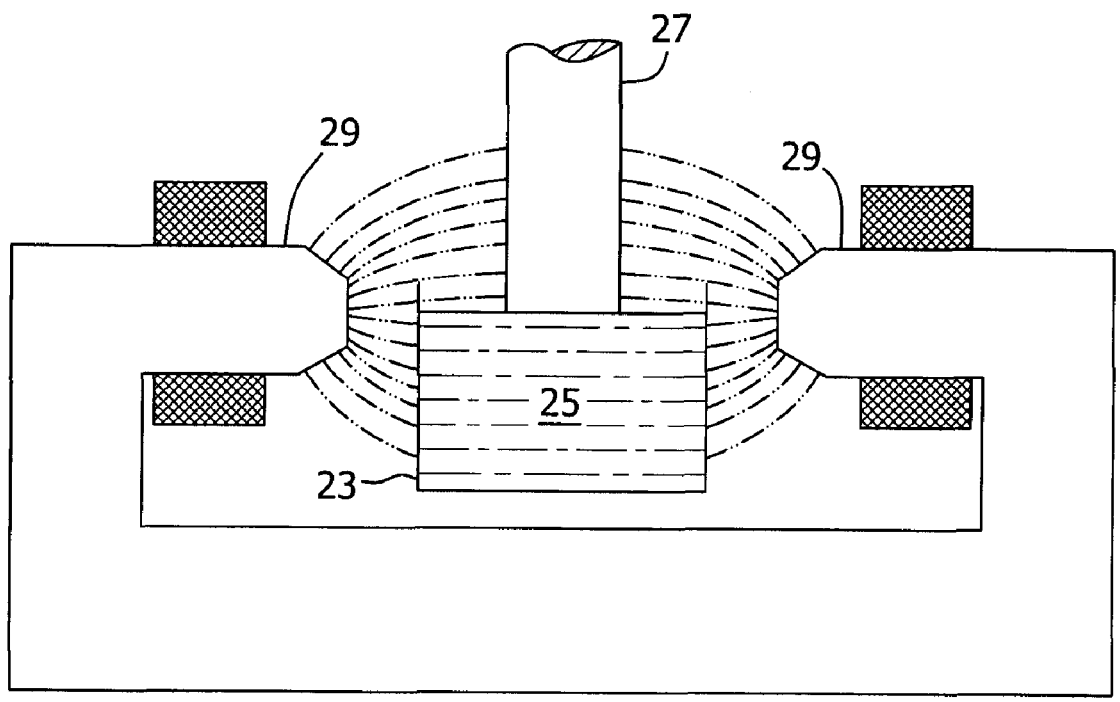
FIG. 2 is a block diagram illustrating a horizontal (also referred to herein as transverse) magnetic field being applied to a crucible containing a melt in a crystal growing apparatus.

FIG. 2 is a block diagram illustrating a horizontal (also referred to herein as transverse) magnetic field being applied to crucible 23, which contains melt 25, in a crystal growing apparatus. In the horizontal magnetic field configuration, two magnetic poles 29 are placed in opposition to generate a magnetic field perpendicular to the crystal-growth direction.

Figure 3:
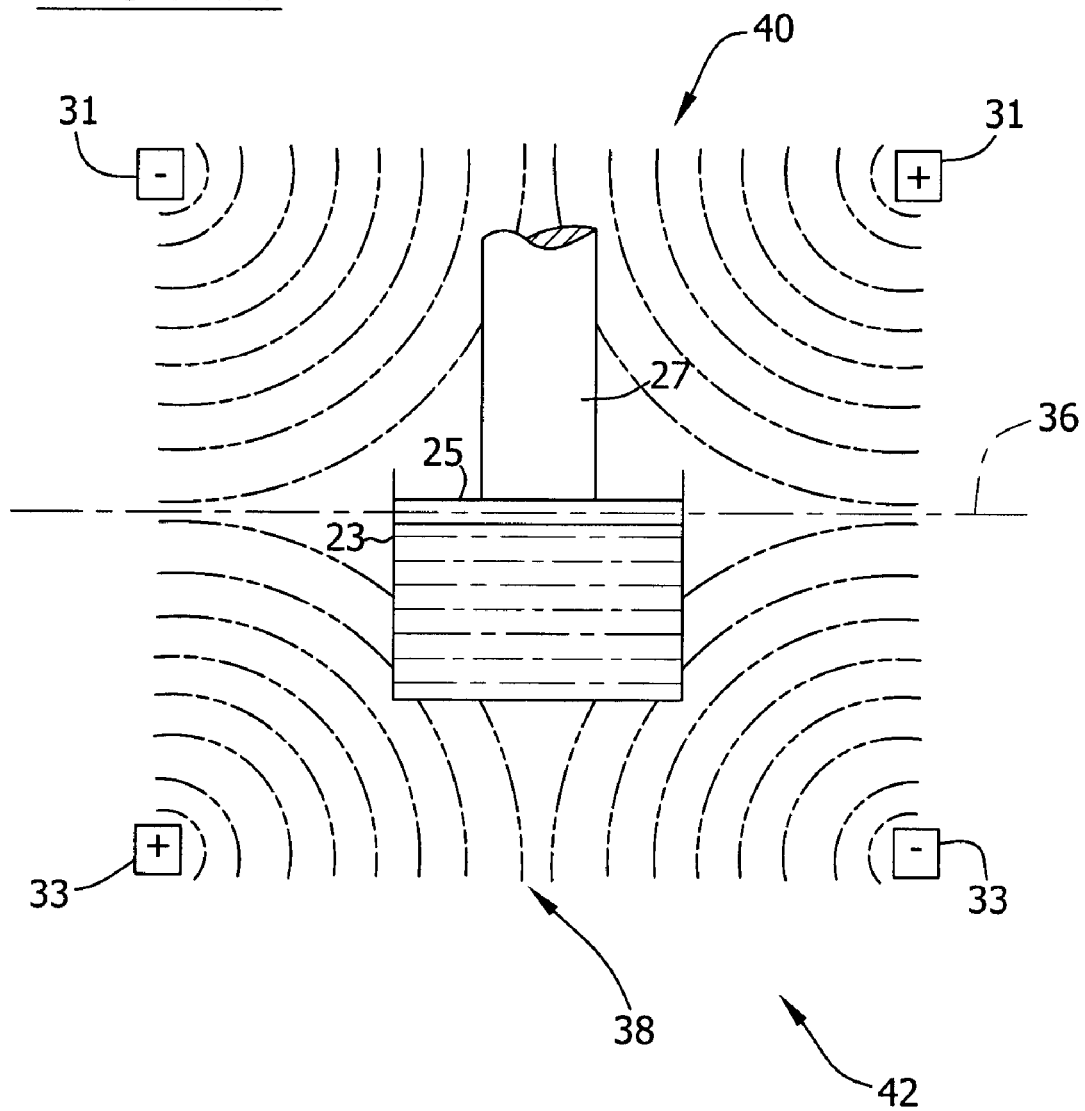
FIG. 3 is a block diagram illustrating a cusped magnetic field being applied to a crucible containing a melt in a crystal growing apparatus.

FIG. 3 is a block diagram illustrating a cusped magnetic field being applied to crucible 23, which contains melt 25, in a crystal growing apparatus. The cusped magnetic field configuration is designed to overcome deficiencies of the axial and horizontal magnetic field configurations. A pair of coils 31 and 33 (e.g., Helmholtz coils) placed coaxially above and below a melt-solid interface 36 and operated in an opposed current mode to generate a magnetic field that has a purely radial field component near the melt surface 36 and a purely axial field component near a center 38 of the melt 25. The combination of an upper magnetic field 40 and a lower magnetic field 42, produced by coils 31 and 33 respectively, results in axial and radial cusped magnetic field components.

In the exemplary embodiment, a process parameter is adjusted to modify the melt-solid interface shape. More specifically, in the exemplary embodiment, a magnetic field is applied in such a manner that the melt-solid interface shape is affected. In the exemplary embodiment, a cusped magnetic field is unbalanced, resulting in stronger axial components of the magnetic field at the melt-solid interface, and influencing a melt flow to enhance the Karman cell and thereby increase the depth of the melt-solid interface. A desirable effect of the unbalanced cusped magnetic field is production of a melt-solid interface having a more concave shape relative to the crystal.

Figure 4:
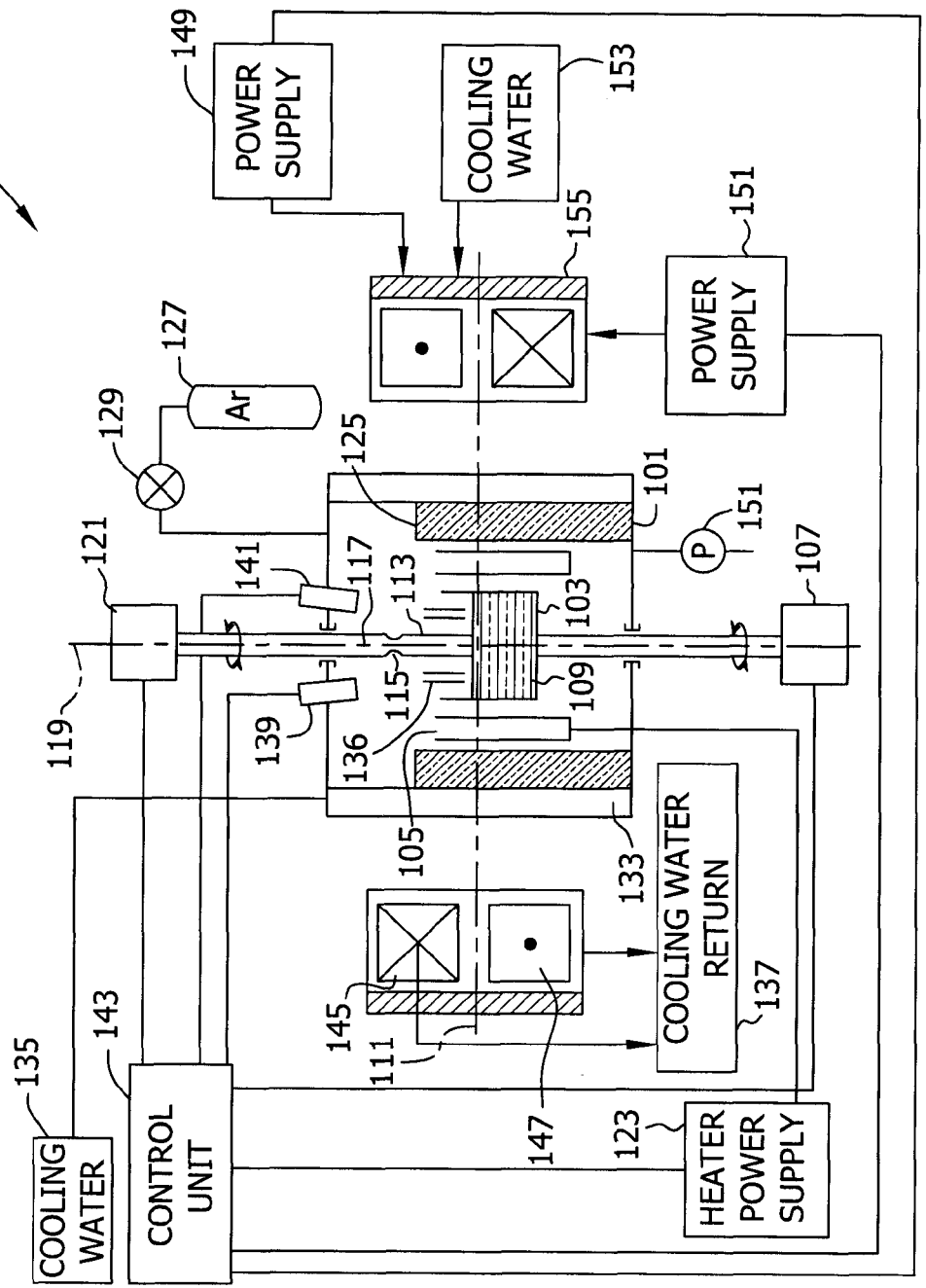
FIG. 4 is a block diagram of an exemplary crystal growing system.

FIG. 4 is a block diagram of an exemplary crystal growing system 100. System 100 employs a Czochralski crystal growth method to produce a semiconductor ingot. In general, the crystal growing system 100 includes a vacuum chamber 101 enclosing a crucible 103. A heater 105, for example, a resistance heater, surrounds the crucible 103. During heating and crystal pulling, a crucible drive unit (e.g., a motor) 107 rotates crucible 103, for example, in the clockwise direction as indicated by the arrow. The crucible drive unit 107 may also raise and/or lower crucible 103 as desired during the growth process. Within crucible 103 is a silicon melt 109 having a melt level 111. In operation, system 100 pulls a single crystal 113, starting with a seed crystal 115 attached to a pull shaft or cable 117, from the melt 109. One end of the pull shaft or cable 117 is connected by way of a pulley (not shown in FIG. 4) to a drum (not shown in FIG. 4), and the other end is connected to a chuck (not shown in FIG. 4) that holds the seed crystal 115 and the crystal 113 grown from seed crystal 115.

Crucible 103 and single crystal 113 have a common axis of symmetry 119. Crucible drive unit 107 can raise crucible 103 along axis 119 as the melt 109 is depleted to maintain its level 111 at a desired height. A crystal drive unit 121 similarly rotates pull shaft or cable 117 in a direction opposite the direction in which crucible drive unit 107 rotates crucible 103 (e.g., counter-rotation). In embodiments using iso-rotation, the crystal drive unit 121 may rotate pull shaft or cable 117 in the same direction in which crucible drive unit 107 rotates crucible 103 (e.g., in the clockwise direction). Iso-rotation may also be referred to as co-rotation. In addition, crystal drive unit 121 raises and lowers the crystal 113 relative to melt level 111 as desired during the growth process.

According to the Czochralski single crystal growth process, a quantity of polycrystalline silicon, or polysilicon, is charged to crucible 103. A heater power supply 123 energizes the resistance heater 105, and insulation 125 lines the inner wall of the vacuum chamber 101. A gas supply 127 (e.g., a bottle) feeds argon gas to vacuum chamber 101 via a gas flow controller 129 as a vacuum pump 151 removes gas from vacuum chamber 101. An outer chamber 133, which is fed with cooling water from a reservoir 135, surrounds vacuum chamber 101. A cooling jacket 136 is positioned between resistance heater 105 and crystal 113. In the exemplary embodiment, cooling jacket 136 may influence a shape of the melt-solid interface (shown in FIGS. 5 and 6). More specifically, in some embodiments, without cooling jacket 136, system 100 may produce an interface shape that is concave shaped relative to crystal 113, where the concave shape has a depth of approximately three millimeters (3 mm). However, by including cooling jacket 136, the depth of the concave shape may be increased, for example, to approximately five millimeters (5 mm).

The cooling water is then drained to a cooling water return manifold 137. Typically, a temperature sensor such as a photocell 139 (or pyrometer) measures the temperature of melt 109 at its surface, and a diameter transducer 141 measures the diameter of single crystal 113. A processor such as a control unit 143 processes the signals generated by the photocell 139 and the diameter transducer 141. The control unit 143 may be a programmed digital or analog computer that controls crucible drive unit 107, crystal drive unit 121, heater power supply 123, vacuum pump 151, and gas flow controller 129 (e.g., an argon flow controller). In the exemplary embodiment, system 100 does not include an upper heater. The presence of an upper heater, or lack of an upper heater, alters cooling characteristics of the crystal 113.

In the exemplary embodiment, an upper magnet, such as a solenoid coil 145, and a lower magnet, such as a solenoid coil 147, may be located above and below, respectively, melt level 111. In the exemplary embodiment, the coils 145 and 147, shown in cross-section, surround vacuum chamber 101 and share axes with axis of symmetry 119. The upper and lower coils 145 and 147 have separate power supplies, namely, an upper coil power supply 149 and a lower coil power supply 151, each of which is connected to and controlled by control unit 143.

Current flows in opposite directions in the two solenoid coils 145 and 147 to produce a magnetic field. A reservoir 153 provides cooling water to the upper and lower coils 145 and 147 before draining via cooling water return manifold 137. A ferrous shield 155 surrounds coils 145 and 147 to reduce stray magnetic fields and to enhance the strength of the field produced.

In the exemplary embodiment, system 100 produces silicon crystal ingots suitable for use in device manufacturing. Advantageously, system 100 may be used to produce silicon crystal 113, a substantial portion or all of which is substantially free of agglomerated intrinsic point defects. That is, a substantial portion or all of crystal 113 produced may have a density of defects of less than about $1 \times 10^4$ defects/cm$^3$, less than about $5 \times 10^3$ defects/cm$^3$, less than about $1 \times 10^3$ defects/cm$^3$, or even no detectable agglomerated intrinsic point defects. Furthermore, system 100 may be used to produce crystal 113 having substantially no agglomerated defects that are larger than about sixty nanometers (nm) in diameter.

Figure 5:
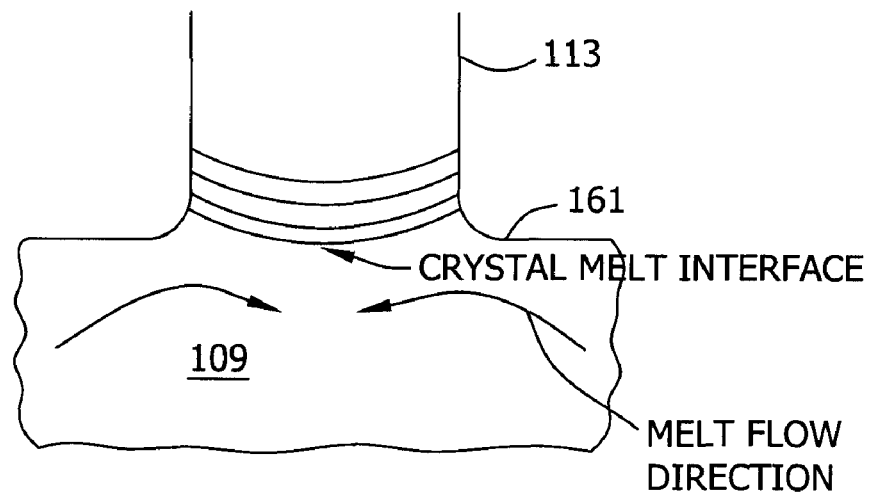
FIGS. 5 and 6 illustrate exemplary melt-crystal interfaces.
Figure 6:
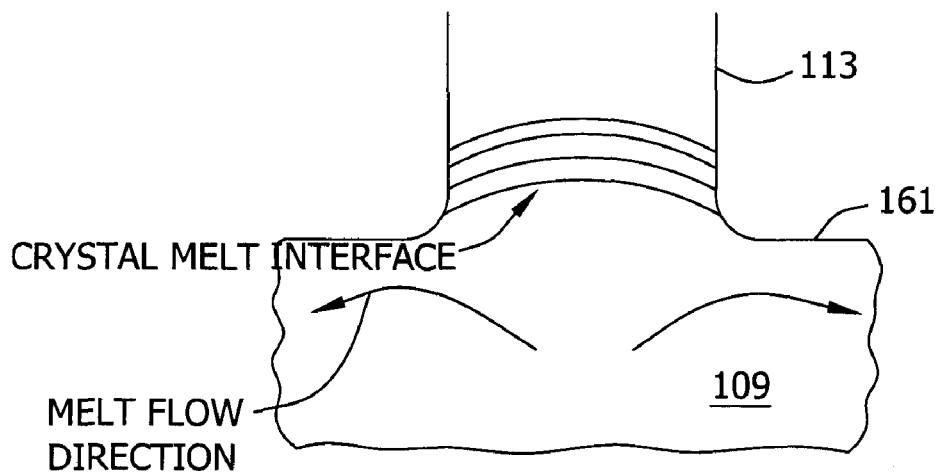

The shape of the melt-solid or melt-crystal interface is controlled during crystal growth to limit and/or suppress the formation of agglomerated intrinsic point defects. FIGS. 5 and 6 illustrate exemplary melt-solid interfaces, extending from a melt surface 161. The shape of this interface between melt 109 and silicon crystal 113 may be concave (shown in FIG. 6) or convex (shown in FIG. 5) in shape relative to the crystal 113, or a combination of both concave and convex (also referred to as a "gull-wing" shape). As described below, controlling the melt-solid interface shape facilitates a reduction in crystal growth defects.

In the exemplary embodiment, melt convection is employed to affect the melt-solid interface shape. Convection refers to the process of heat transfer in a liquid by the movement of the liquid itself. In general, there are two types of convection: natural convention and forced convection. Natural convection occurs when the movement of melt 109 is due, for example, to the presence of heaters 105 giving rise to density gradients. Forced convection occurs when the movement of the melt 109 is due to an external agent such as a magnetic field in crucible 103. Accordingly, controlling the magnetic field may facilitate producing a desired melt-solid interface shape.

Figure 7:
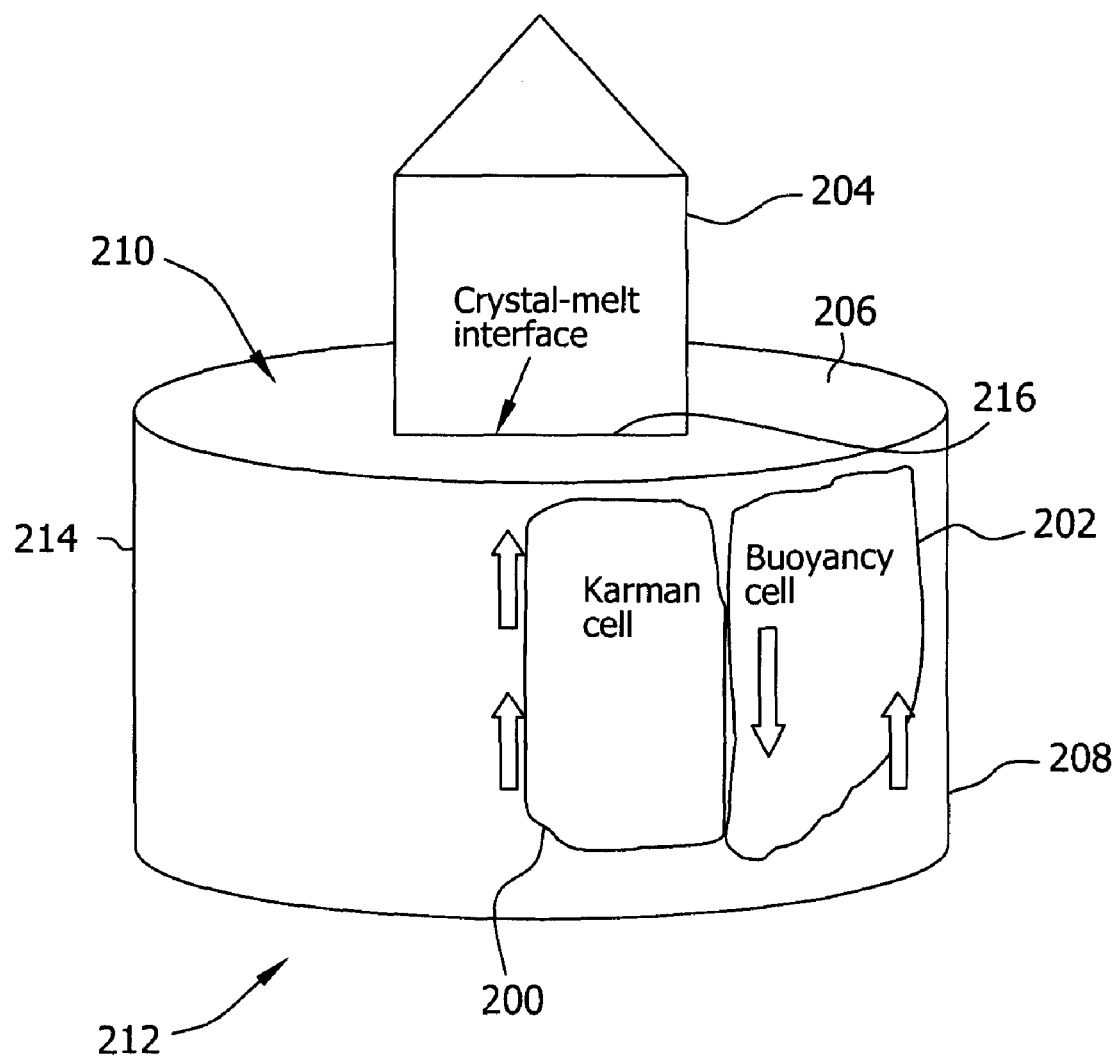
FIG. 7 is a schematic diagram of melt flow cells formed during crystal growth.

FIG. 7 is a schematic diagram of melt flow cells 200 and 202 formed during crystal growth. In the exemplary embodiment, a crystal 204 is pulled from a melt 206 held within a crucible 208. Crucible 208 includes a top 210, a bottom 212, and a crucible wall 214. In the exemplary embodiment, melt flow cells 200 and 202 are formed in melt 206 during crystal 204 growth occurring while crystal 204 and crucible 208 are rotated in the same direction (i.e., iso-rotation). More specifically, the two types of flow cells formed in melt 206 are a Karman cell 200 and a buoyancy cell 202. The Karman cell 200 is formed directly below crystal 204 and the buoyancy cell 202 is formed along crucible wall 214. Different flow cells are formed under counter-rotation conditions, including an Eckmann cell (not shown in FIG. 7). The presence of an Eckmann cell does not facilitate formation of as concave of a melt-solid interface 216 as does the presence of Karman cell 200.

Strengthening Karman cell 200 facilitates the formation of a more concave melt-solid interface 216 shape relative to crystal 204 (shown in FIG. 6). Karman cell 200 can be made stronger by either applying an axial magnetic field or by increasing the component of the axial magnetic field in an applied cusped magnetic field. The axial magnetic field also has an effect of increasing a melt temperature at bottom 212 of crucible 208, bringing in more heat, which also facilitates formation of a more concave shape of melt-solid interface 216.

In the exemplary embodiment, an axial component of a cusped magnetic field applied during a crystal growing process is increased by unbalancing the upper magnetic field 40 (shown in FIG. 3) and the lower magnetic field 42 (shown in FIG. 3). In some embodiments, a balanced cusped magnetic field is defined herein as a cusped magnetic field wherein the upper magnetic field 40 (i.e., the magnetic field produced by coils 31 (shown in FIG. 3)) is of substantially equal strength to the lower magnetic field 42 (i.e., the magnetic field produced by coil 33 (shown in FIG. 3)). Conversely, in some embodiments, an unbalanced cusped magnetic field is defined herein as a cusped magnetic field wherein the upper magnetic field 40 has a substantially different strength than the lower magnetic field 42. Additionally, a balanced cusped magnetic field has a purely radial field component near melt surface 36 (shown in FIG. 3). In contrast, an unbalanced cusped magnetic field does not include a purely radial field component near melt surface 36, but rather, also includes an axial field component near melt surface 36. As used herein, since magnetic field strength varies according to, for example, a distance from the source, when comparing a strength of a first magnetic field produced by a first coil to a strength of a second magnetic field produced by a second coil, the first magnetic field strength is measured at a point that is a distance, X, from the first coil, and the second magnetic field strength is measured at a point that is the same distance, X, from the second coil.

In the exemplary embodiment, the unbalanced cusped magnetic field is constant. In other words, a ratio between the strength of the upper magnetic field 40 and the lower magnetic field 42 is not varied during the crystal growth process. The constant magnetic ratio facilitates maintaining the axial field component near melt surface 36. In alternative embodiments, the ratio between the strength of the upper magnetic field 40 and the lower magnetic field 42 is varied during the crystal growth process, to facilitate maintaining a desired strength of the axial field component near melt surface 36. The ratio may be varied by adjusting the current supplied to upper coil 31 and/or lower coil 33. Moreover, the ratio may be varied as a function of time and/or crystal length to facilitate matching the strength of the axial field component of the unbalanced cusped magnetic field to different crystal growth stages and/or different crystal lengths.

In the exemplary embodiment, the strength of upper magnetic field 40, the strength of lower magnetic field 42, and/or the ratio between the strength of upper magnetic field 40 and lower magnetic field 42 are determined based at least in part on the effect the unbalanced cusped magnetic field has on the melt flow cells (e.g., Karman cell 200 and buoyancy cell 202). The strength of upper magnetic field 40 and/or the strength of lower magnetic field 42 may be determined such that Karman cell 200 is strengthened and/or buoyancy cell 202 is weakened. Furthermore, the ratio between the strength of upper magnetic field 40 and the strength of lower magnetic field 42 may be determined such that Karman cell 200 is strengthened and/or buoyancy cell 202 is weakened.

FIGS. 8A, 8B, and 8C illustrate an exemplary melt flow simulation 300, an exemplary temperature field simulation 310 of temperatures in the melt 206, and an exemplary magnetic field vector simulation 320, respectively, during crystal growth under a balanced cusped magnetic field. In the illustrated example, a magnetic ratio between the strength of upper magnetic field 40 (shown in FIG. 3) and the strength of lower magnetic field 42 (shown in FIG. 3) is one. In other words, the upper magnetic field 40 is of substantially equal strength to the strength of lower magnetic field 42. For example, to facilitate production of the balanced cusped magnetic field, upper coil 31 (shown in FIG. 3) and lower coil 33 (shown in FIG. 3) are both provided with a level of current that is forty-five percent (45%) of a maximum current level available to coils 31 and 33.

FIGS. 9A, 9B, and 9C illustrate an exemplary melt flow simulation 330, an exemplary temperature field simulation 340 of temperatures in the melt 206, and an exemplary magnetic field vector simulation 350, respectively, during crystal growth under an unbalanced cusped magnetic field. The unbalanced cusped magnetic field shown in FIG. 9C has an increased axial component when compared to the magnetic field produced by a balanced cusped magnetic field (shown in FIG. 8C). The increased axial component of the applied unbalanced magnetic field is especially noticeable near melt-solid interface 216.

In the illustrated embodiment, a magnetic ratio between upper magnetic field 40 and lower magnetic field 42 is approximately 0.64. More specifically, in the illustrated embodiment, the strength of upper magnetic field 40 is approximately 0.64 of the strength of lower magnetic field 42. More specifically, in some embodiments, the magnetic ratio between the strength of upper magnetic field 40 and lower magnetic field 42 may be from 0.10 to 0.90. In other embodiments, the magnetic ratio between the strength of upper magnetic field 40 and lower magnetic field 42 may be from 0.40 to 0.70.

A magnetic ratio of 0.64, by way of example only, may be achieved by providing upper coil 31 with a level of current that is approximately twenty-nine percent (29%) of a maximum current level available to coils 31 and 33, and providing lower coil 33 with a level of current that is approximately forty-five percent (45%) of a maximum current level available to coils 31 and 33. However, any suitable ratio of upper coil 31 and lower coil 33 current levels that facilitates production of a desired magnetic ratio may also be supplied to upper coil 31 and lower coil 33.

Additionally, a comparison of FIG. 8B and FIG. 9B shows higher temperatures directly below crystal 204 when an unbalanced cusped magnetic field is applied to melt 206. In some examples, when compared to the application of a balanced magnetic field, the unbalanced cusped magnetic field may increase the temperature directly below crystal 204 by approximately one to five kelvin, or more specifically, by approximately three to five kelvin. In the exemplary embodiment, the higher temperature focused directly below crystal 204 in FIG. 9B is not caused by an increase in the heat energy provided to crucible 208, but rather is caused by the increased axial component of the applied cusped magnetic field at melt-solid interface 216. The melt flow simulations (shown in FIGS. 8A and 9A) illustrate the stronger Karman cell formed when the magnetic field applied during the crystal forming process is unbalanced, specifically, with a lower field strength from upper coil 31 than from lower coil 33.

Figure 10:
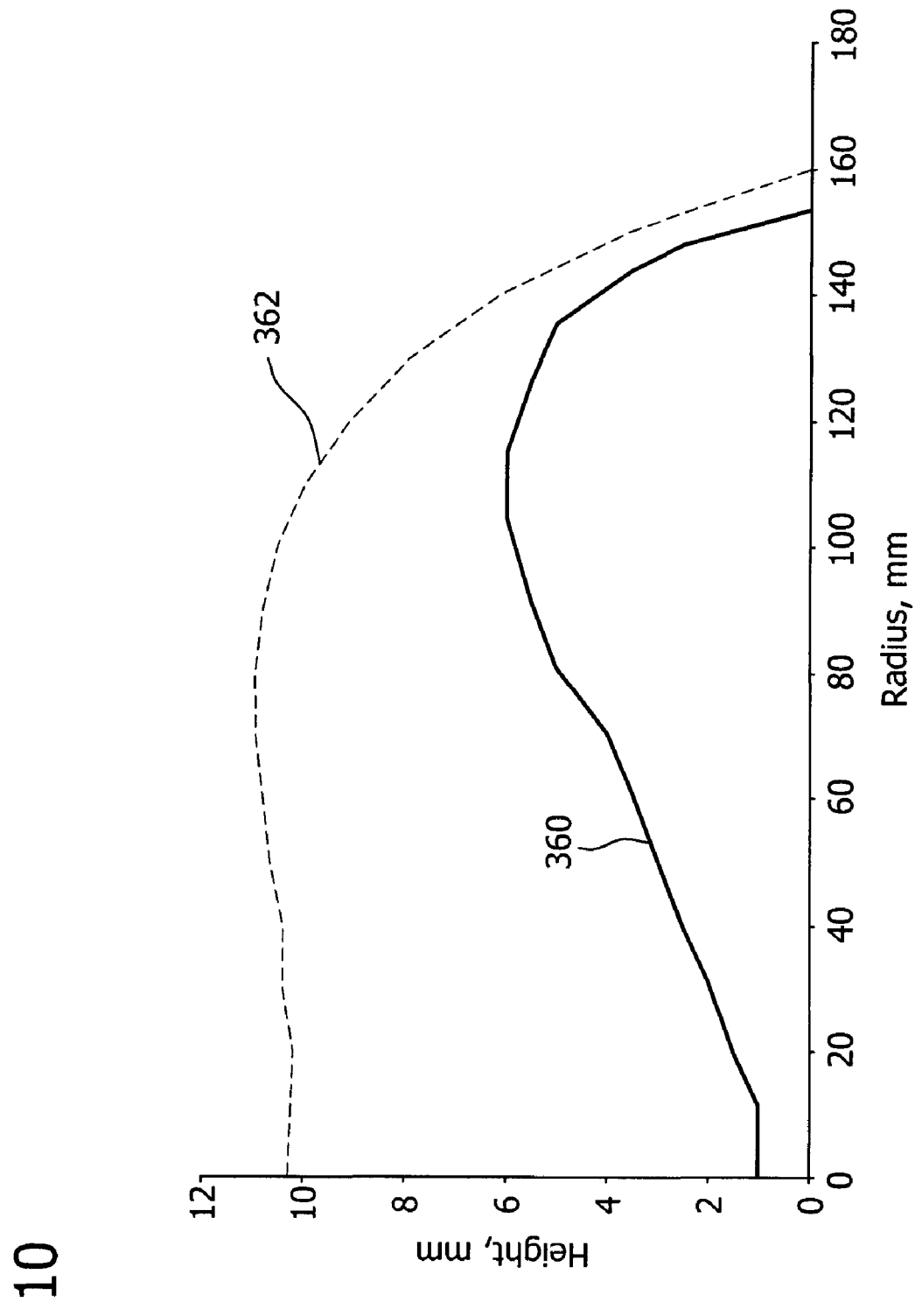
FIG. 10 is an illustration of two exemplary melt-solid interfaces.

FIG. 10 is an illustration of two exemplary melt-solid interfaces 360 and 362. More specifically, exemplary melt-solid interface 360 is an example of a melt-solid interface of a crystal grown under the presence of a balanced cusped magnetic field. In contrast, exemplary melt-solid interface 362 is an example of a melt-solid interface of a crystal grown under the presence of an unbalanced cusped magnetic field. In some embodiments, the application of an unbalanced cusped magnetic field facilitates creation of melt-solid interface 362, which is more concave than melt-solid interface 360. A convex shaped interface, for example, melt-solid interface 360, does not provide a process window that makes typical manufacturing processes feasible.

In an example embodiment, crystals having a diameter of three-hundred millimeters (300 mm) are grown under an applied unbalanced cusped magnetic field. As described above, the cusped magnetic field typically applied during crystal growth has both lower and upper magnetic fields of substantially equal strength. In the example embodiment, the lower magnet generates a stronger magnetic field than the upper magnet generates. For example, an upper magnet may be maintained to produce a magnetic field that is twenty percent (20%) of the strength of the magnetic field generated by the lower magnet. In the example embodiment, as shown in FIG. 10, the melt-solid interface is measured under the unbalanced cusped magnetic field condition at a crystal length of 300 mm, by removing the crystal from the melt and measuring the interface shape.

It is advantageous to control the shape of melt-solid interface 362. Obtaining a more concave-shaped melt-solid interface (shown in FIG. 6) facilitates increasing a process window for crystal growth. In the exemplary embodiment, process parameters are modified to improve the interface shape (i.e., produce a more concave-shaped interface relative to the crystal). Process parameters such as seed rotation and crucible rotation can be used to modify the interface shape, however these parameters alone may not be sufficient to make a significant change in the interface shape and therefore make significant improvements in the process window. In the exemplary embodiment, as described above, unbalancing a cusped magnetic field applied during formation of a crystal, in combination with iso-rotation of the seed and the crucible, facilitates further modification of a melt-solid interface shape.

Figure 11:
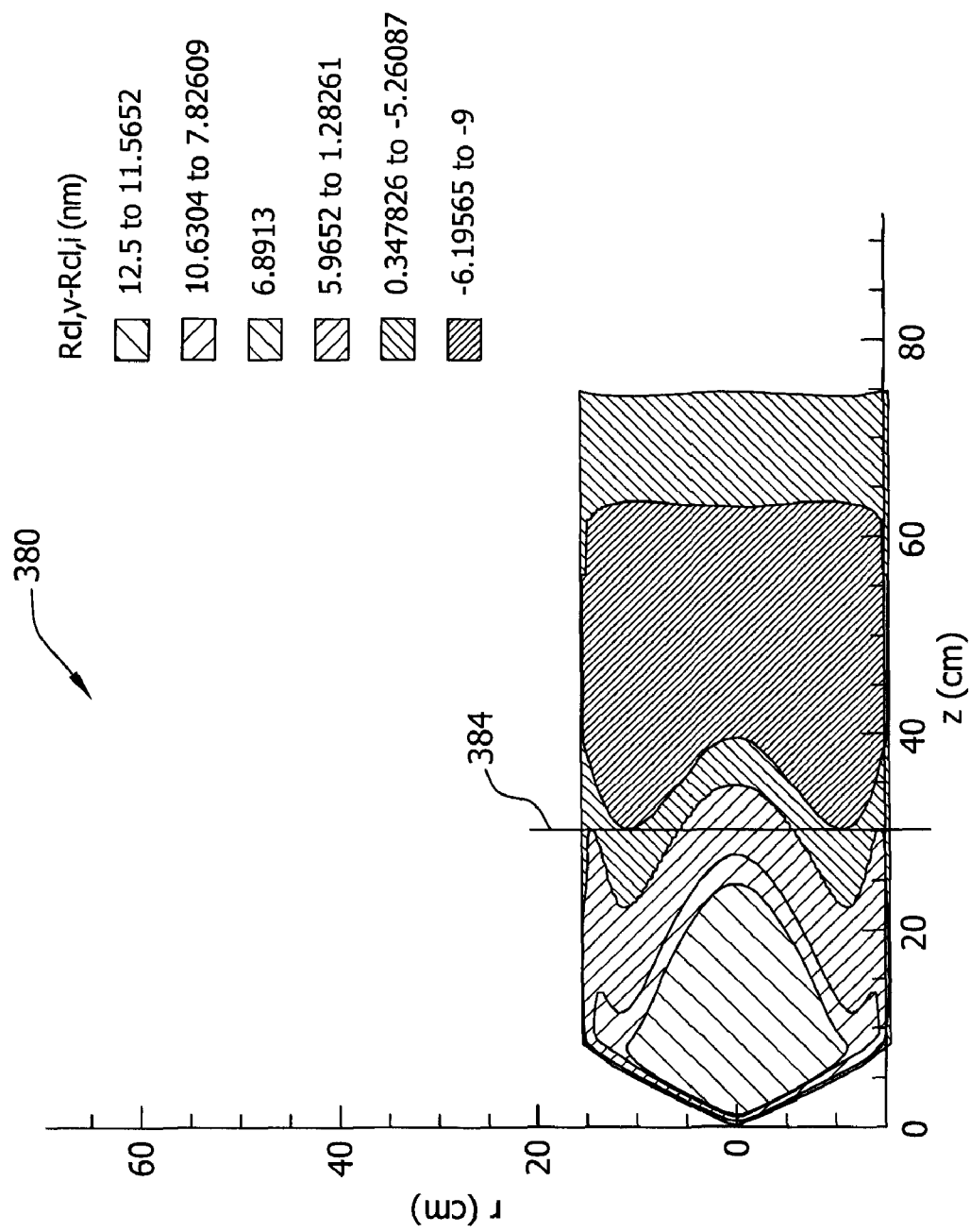
FIG. 11 is an exemplary defect transition diagram for a crystal grown in the presence of a balanced magnetic field.
Figure 12:
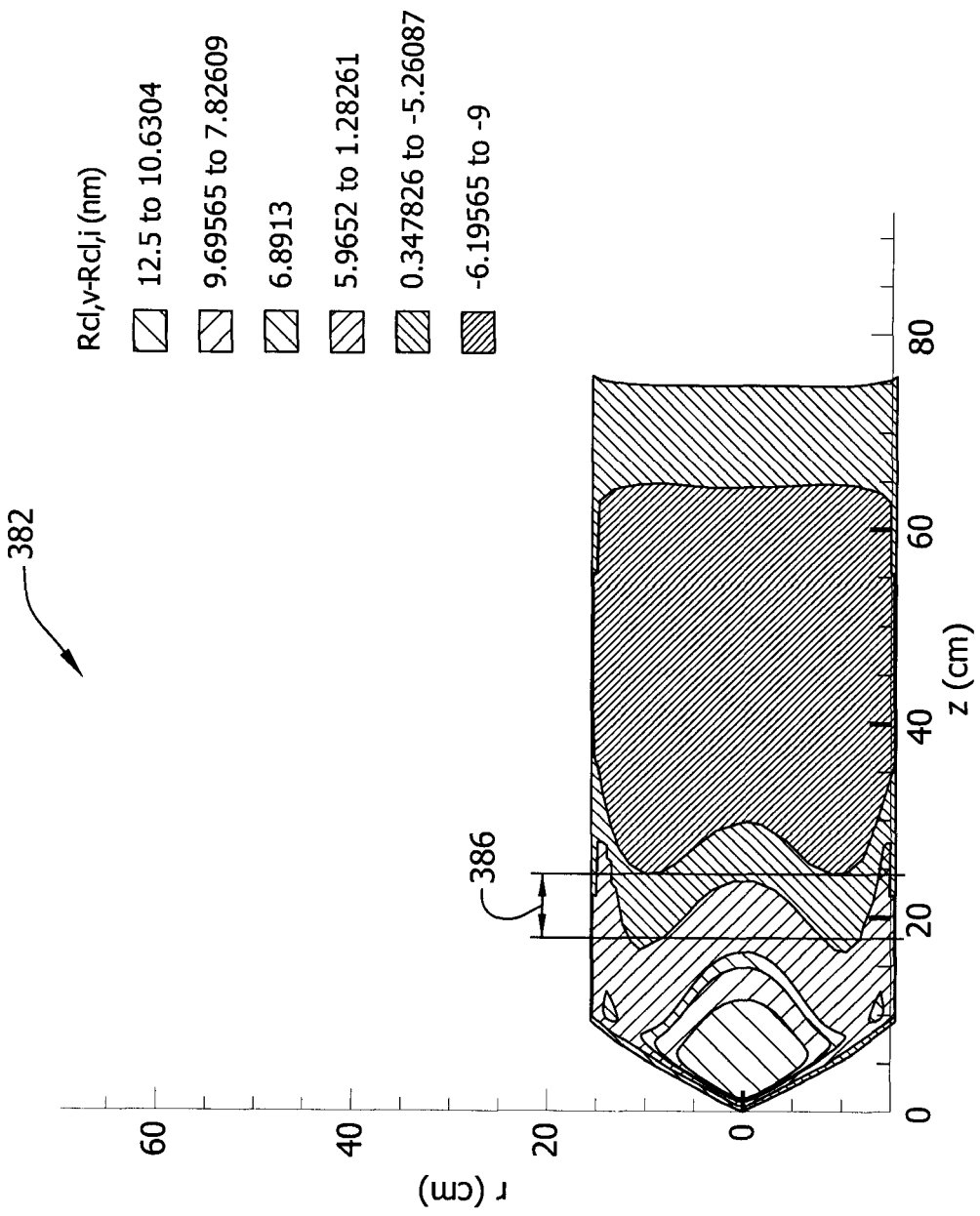
FIG. 12 is an exemplary defect transition diagram for a crystal grown in the presence of an unbalanced magnetic field.

FIG. 11 is an exemplary defect transition diagram 380 for a crystal grown in the presence of a balanced magnetic field. FIG. 12 is an exemplary defect transition diagram 382 for a crystal grown in the presence of an unbalanced magnetic field. Defect transition diagrams 380 and 382 may be used in determining a pull-rate window, also referred to as a process window. Defect transition diagram 380 illustrates a negative process window 384. In contrast, defect transition diagram 382 shows an increased process window 386 with a flatter defect transition.

FIG. 13 is a flowchart 400 of an exemplary method for controlling crystal growth in a crystal growing system, for example, crystal growing system 100 (shown in FIG. 4). More specifically, FIG. 13 illustrates an exemplary method for controlling the growth of a monocrystalline ingot produced according to a Czochralski process. In the exemplary embodiment, controlling crystal growth in a crystal growing system includes controlling a shape of the melt-solid interface of the ingot, and more specifically, includes facilitating production of an ingot having a substantially concave melt-solid interface shape (shown in FIG. 6).

The systems and methods described herein are designed for use with a twenty-eight inch hot zone (e.g., a twenty-eight inch crucible). However, the benefits described herein may also be achieved by applying the systems and methods described herein to any other sized hot zone, for example, a thirty-two inch hot zone, a twenty-four inch hot zone, and a twenty-two inch hot zone.

As described above, the crystal growing system includes a heated crucible including a semiconductor melt from which the ingot is pulled. The ingot is grown on a seed crystal pulled from the melt. The exemplary method includes determining 402 a level of current to apply to an upper coil and a level of current to apply to a lower coil of a crystal growing system to obtain a desired unbalanced cusped magnetic field. For example, a level of current to apply to upper coil 145 (shown in FIG. 4) and a level of current to apply to lower coil 147 (shown in FIG. 4) of crystal growing system 100 may be determined 402 to obtain a desired unbalanced cusped magnetic field. The levels of current to be applied to upper coil 145 and to lower coil 147 are determined 402 such that when applied to the semiconductor melt, the resulting upper magnetic field 40 (shown in FIG. 3) and the resulting lower magnetic field 42 (shown in FIG. 3) facilitate maximizing a strength of Karman cell 200 (shown in FIG. 7) and/or minimizing a strength of buoyancy cell 202 (shown in FIG. 7). Furthermore, the current levels to be applied to upper coil 145 and to lower coil 147 may be determined 402 such that a desired ratio between the resulting strength of upper magnetic field 40 and the resulting strength of lower magnetic field 42 is obtained. The ratio between the strength of upper magnetic field 40 and the strength of lower magnetic field 42 that maximizes a strength of Karman cell 200 and/or minimizes a strength of buoyancy cell 202 may be determined.

The exemplary method also includes applying 404 an unbalanced cusped magnetic field to the melt. For example, the determined 402 levels of current are applied to upper coil 145 and to lower coil 147, which generate the unbalanced cusped magnetic field. The unbalanced cusped magnetic field is then applied 404 to the melt. The exemplary method also includes rotating 406 the ingot and the crucible in the same direction while the ingot is being pulled from the melt. In some embodiments, applying 404 an unbalanced cusped magnetic field includes applying upper magnetic field 40 above a melt-solid interface and lower magnetic field 42 below a melt-solid interface. For example, the unbalanced magnetic field may be imposed by upper coil 145 positioned above melt-solid interface 111 (shown in FIG. 4) and lower coil 147 positioned below melt-solid interface 111. In the exemplary embodiment, the field strength of upper magnetic field 40 is weaker than the field strength of lower magnetic field 42. More specifically, in some embodiments, the field strength of upper magnetic field 40 may be from 5% to 50% of the field strength of lower magnetic field 42. In other embodiments, the field strength of upper magnetic field 40 may be from 10% to 30% of the field strength of lower magnetic field 42. The ratio between the strength of upper magnetic field 40 and the strength of lower magnetic field 42 may be any suitable ratio that allows crystal growing system 100 to function as described herein.

Applying 404 an unbalanced cusped magnetic field to the melt includes applying the upper and the lower magnetic fields such that an axial component of the applied magnetic field is greater than a radial component of the applied magnetic field at the melt-solid interface (shown in FIG. 9C).

The above described methods and systems for controlling crystal growth are cost-effective and highly accurate. The methods and systems facilitate controlling the shape of a melt-solid interface of a monocrystalline ingot grown according to a Czochralski process. Controlling the shape of a melt-solid interface facilitates increasing a process window for production of monocrystalline silicon. Combining the application of an unbalanced cusped magnetic field and iso-rotation of the crystal and the crucible facilitates production of a melt-solid interface having a generally concave shape relative to the crystal. A melt-solid interface having a generally concave shape relative to the crystal provides a desired process window and defect transition.

The order of execution or performance of the methods illustrated and described herein is not essential, unless otherwise specified. That is, it is contemplated by the inventors that elements of the methods may be performed in any order, unless otherwise specified, and that the methods may include more or less elements than those disclosed herein.

When introducing elements of the methods and systems described above, or embodiments thereof, the articles "a," "an," "the," and "said" are intended to mean that there are one or more of the elements. The terms "comprising," "including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of controlling crystal growth in a crystal growing system, the crystal growing system having a heated crucible including a semiconductor melt from which a monocrystalline ingot is grown according to a Czochralski process, the ingot being grown on a seed crystal pulled from the melt, said method comprising:
    applying an unbalanced cusped magnetic field to the melt comprising a first magnetic field and a second magnetic field, the first magnetic field having a field strength that is different than a field strength of the second magnetic field, wherein the strength of at least one of the first magnetic field and the second magnetic field is such that a Karman cell formed directly below the seed crystal in the semiconductor melt is strengthened, and wherein strengthening the Karman cell facilitates the formation of a concave melt-solid interface; and
    rotating the ingot and the crucible in the same direction while the ingot is being pulled from the melt.

2. A method in accordance with claim 1, wherein applying an unbalanced cusped magnetic field comprises applying the first magnetic field above a melt-solid interface and the second magnetic field below the melt-solid interface, wherein the field strength of the first magnetic field is weaker than the field strength of the second magnetic field.

3. A method in accordance with claim 2, wherein a ratio of the field strength of the first magnetic field to the field strength of the second magnetic field is between 0.10 and 0.90.

4. A method in accordance with claim 1, wherein applying an unbalanced cusped magnetic field comprises applying the first magnetic field above a melt-solid interface and the second magnetic field below a melt-solid interface such that an axial component of the applied magnetic field is greater than a radial component of the applied magnetic field at the melt-solid interface.

5. A method in accordance with claim 4, wherein applying the first magnetic field above the melt-solid interface and the second magnetic field below the melt-solid interface comprises applying a constant first magnetic field and a constant second magnetic field to facilitate maintaining the axial component of the applied magnetic field at the melt-solid interface.

6. A method in accordance with claim 4, wherein applying the first magnetic field above the melt-solid interface and the second magnetic field below the melt-solid interface comprises varying the strength of at least one of the first magnetic field and the second magnetic field to facilitate maintaining a predetermined strength of the axial component of the applied magnetic field at the melt-solid interface.

7. A method in accordance with claim 1, wherein controlling crystal growth in a crystal growing system comprises controlling a shape of the melt-solid interface of the ingot.

8. A method in accordance with claim 7, wherein controlling a shape of the melt-solid interface comprises facilitating production of an ingot having a substantially concave melt-solid interface shape relative to the ingot.

9. A system for growing silicon crystals that facilitates controlling a shape of a melt-solid interface, said crystal growing system having a heated crucible including a semiconductor melt from which a monocrystalline ingot is grown according to a Czochralski process, said ingot being grown on a seed crystal pulled from the melt, said melt and said ingot forming said melt-solid interface therebetween, said system comprising:
    a first set of coils and a second set of coils positioned adjacent to an exterior of the crucible for generating an unbalanced cusped magnetic field, the unbalanced cusped magnetic field comprising a first magnetic field and a second magnetic field, the first magnetic field having a field strength that is different than a field strength of the second magnetic field, wherein the strength of at least one of the first magnetic field and the second magnetic field is such that at least one of a Karman cell is strengthened and a buoyancy cell is weakened; and a crucible drive unit and a crystal drive unit configured to rotate the crucible and the crystal in the same direction.

10. A system in accordance with claim 9, wherein said first set of coils are positioned above the melt-solid interface and said second set of coils are positioned below the melt-solid interface, wherein said first set of coils are configured to generate the first magnetic field and said second set of coils are configured to generate the second magnetic field.

11. A system in accordance with claim 10, wherein said first set of coils and said second set of coils are configured to generate magnetic fields having an axial component that is greater than a radial component at the melt-solid interface.

12. A system in accordance with claim 10, wherein the field strength of the first magnetic field is weaker than the field strength of the second magnetic field.

13. A system in accordance with claim 10, wherein a ratio of the field strength of the first magnetic field to the field strength of the second magnetic field is between 0.10 and 0.90.

14. A system in accordance with claim 10, wherein a ratio of the field strength of the first magnetic field to the field strength of the second magnetic field is between 0.40 and 0.70.

15. A system in accordance with claim 9, wherein said first set of coils is powered by a first level of current and said second set of coils is powered by a second level of current.

16. A system in accordance with claim 15, wherein said first level of current is lower than said second level of current.

17. A system in accordance with claim 9, wherein said unbalanced cusped magnetic field generated by said first and second set of coils, in combination with said rotation in the same direction of the crucible and the crystal by said crucible drive unit and said crystal drive unit, respectively, facilitates controlling a shape of the melt-solid interface of the ingot.

18. A system in accordance with claim 17, wherein said shape of the melt-solid interface of the ingot comprises a substantially concave melt-solid interface shape relative to the ingot.

19. A system in accordance with claim 9, wherein said unbalanced cusped magnetic field generated by said first and second set of coils, in combination with said rotation in the same direction of the crucible and the crystal by said crucible drive unit and said crystal drive unit, respectively, facilitates producing an ingot having a desired process window and defect transition.

* * * * *